United States Patent [19]
Norman

[11] Patent Number: 5,787,484
[45] Date of Patent: Jul. 28, 1998

[54] SYSTEM AND METHOD WHICH COMPARES DATA PREREAD FROM MEMORY CELLS TO DATA TO BE WRITTEN TO THE CELLS

[75] Inventor: Robert Norman, San Jose, Calif.

[73] Assignee: Micron Technology, Inc., Boise, Id.

[21] Appl. No.: 689,369

[22] Filed: Aug. 8, 1996

[51] Int. Cl.$^6$ .................................................. G06F 12/00
[52] U.S. Cl. .................... 711/159; 711/137; 711/156; 711/204; 711/213
[58] Field of Search .................... 365/185.22, 430, 365/888, 496, 500

[56] References Cited

U.S. PATENT DOCUMENTS

| | | | |
|---|---|---|---|
| 4,811,294 | 3/1989 | Kobayashi et al. | 365/185.22 |
| 5,357,475 | 10/1994 | Kasbun et al. | 395/430 |
| 5,357,614 | 10/1994 | Pattisam et al. | 395/888 |
| 5,479,638 | 12/1995 | Assar et al. | 395/430 |
| 5,485,595 | 1/1996 | Assar et al. | 395/430 |
| 5,519,847 | 5/1996 | Fandrich et al. | 395/496 |
| 5,581,723 | 12/1996 | Hasbun et al. | 395/430 |
| 5,651,128 | 7/1997 | Gaultier | 395/430 |
| 5,668,976 | 9/1997 | Zook | 395/500 |

Primary Examiner—Tod R. Swann
Assistant Examiner—Fred Fei Tseng
Attorney, Agent, or Firm—Schwegman, Lundberg, Woessner & Kluth, P.A.

[57] ABSTRACT

A memory system which includes one or more arrays of memory cells (e.g., flash memory cells) organized into sets of cells, wherein each set of cells is indicative of a set of stored data, and wherein the system also includes circuitry which compares new data (to be written to a set of cells) with stored data (preread from a corresponding set of cells) and prevents a write of the new data to the array if the new data is identical to the stored data, a computer system including such a memory system, and a method implemented by such a computer system. In preferred embodiments, the system includes a controller which includes logic circuitry which performs the comparison. In response to the comparison determining that the new data to be written is identical to the previously stored data, the controller generates a confirmation signal indicating that the new data has been written to the array, rather than actually writing the new data to the array. Preferably, the system emulates a magnetic disk drive and each of the sets of cells has sufficient capacity to store the same amount of data as can a set of a conventional magnetic disk drive. Preferably, each array of flash memory cells is organized into rows and columns of the cells, and each of the rows is a set of cells capable of storing a sector of data.

53 Claims, 6 Drawing Sheets

SYSTEM AND METHOD WHICH COMPARES DATA PREREAD FROM MEMORY CELLS TO DATA TO BE WRITTEN TO THE CELLS

BACKGROUND OF THE INVENTION

1. Field of the Invention

The invention is a memory system which includes at least one array of memory cells (e.g., flash memory cells) and circuitry which compares new data to be written to a set of the cells with data already stored in a corresponding set of the cells and writes the new data to the array only if the new data is not identical to the previously stored data, and a computer system which includes such a memory system, and method performed by such a computer system. In preferred embodiments, the memory system is designed to emulate a magnetic disk drive.

2. Description of Related Art

It is conventional to implement a memory system as an integrated circuit including an array of flash memory cells and circuitry for independently erasing selected blocks of the cells. FIG. 1 is a simplified block diagram of such an integrated circuit (flash memory chip 103). An integrated flash memory chip such as memory chip 103 of FIG. 1 (or a memory system including such a memory chip) can be modified in accordance with the present invention to avoid unnecessary writes of data to sectors of flash memory array circuit 16.

Flash memory array circuit 16 of memory chip 103 comprises rows and columns of nonvolatile flash memory cells. Memory chip 103 also includes I/O pins DQ0—DQ15 (for asserting output data to an external device or receiving input data from an external device), input buffer circuits 122, 122A, and 122B, output buffer circuits 128, 128A, and 128B, address buffer 17 for receiving address bits A0 through A17 from an external device, row decoder circuit (X address decoder) 12, column multiplexer circuit (Y multiplexer) 14, and control unit 29 (also denoted herein as "controller" 29).

Each of the cells (storage locations) of memory array circuit 16 is indexed by a row index (an "X" index determined by decoder circuit 12) and a column index (a "Y" index determined by Y decoder circuit 13 of circuit 14). Each column of cells of memory array 16 comprises "n" memory cells, each cell implemented by a floating-gate N-channel transistor. The drains of all transistors of a column are connected to a bitline, and the gate of each of the transistors is connected to a different wordline, and the sources of the transistors are held at a source potential (which is usually ground potential for the chip during a read or programming operation). Each memory cell is a nonvolatile memory cell since the transistor of each cell has a floating gate capable of semipermanent charge storage. The current drawn by each cell (i.e., by each of the N-channel transistors) depends on the amount of charge stored on the cell's floating gate. Thus, the charge stored on each floating gate determines a data value that is stored "semipermanently" in the corresponding cell. In cases in which each of the N-channel transistors is a flash memory device, the charge stored on the floating gate of each is erasable (and thus the data value stored by each cell is erasable) by appropriately changing the voltage applied to the gate and source (in a well known manner).

The individual memory cells (not depicted) are addressed by eighteen address bits (A0–A17), with nine bits being used by X decoder circuit 12 to select the row of array 16 in which the target cell (or cells) is (or are) located and the remaining nine bits being used by Y decoder circuit 13 (of Y-multiplexer 14) to select the appropriate column (or columns) of array 16. Typically, a set of eight or sixteen target cells (or 256 target cells) in a single row of the array are selected by a single set of eighteen address bits A0–A17, with Y decoder circuit 13 determining the column addresses of such cells in response to a nine-bit subset of the set of address bits. In response to the other nine address bits A0–A17, X decoder circuit 12 determines a row address which selects one cell in the selected column.

In a normal operating mode, chip 103 executes a write operation as follows. Address buffer 17 asserts appropriate ones of address bits A0–A17 to circuit 14 and decoder circuit 12. In response to these address bits, circuit 14 determines a column address (which selects one of the columns of memory cells of array 16), and circuit 12 determines a row address (which selects one cell in the selected column). In response to a write command supplied from controller 29, a signal (indicative of data) present at the output of input buffer 122, 122A, and/or 122B is asserted through circuit 14 to the cell of array 16 determined by the row and column address (e.g., to the drain of such cell). During such write operation, output buffers 128, 128A, and 128B are disabled.

In the normal operating mode, chip 103 executes a read operation as follows. Address buffer 17 asserts appropriate ones of address bits A0–A17 to circuit 14 and address decoder circuit 12. In response to these address bits, circuit 14 asserts a column address to memory array 16 (which selects one of the columns of memory cells), and circuit 12 asserts a row address to memory array 16 (which selects one cell in the selected column). In response to a read command supplied from control unit 29, a current signal indicative of a data value stored in the cell of array 16 (a "data signal") determined by the row and column address is supplied from the drain of the selected cell through the bitline of the selected cell and then through circuit 14 to sense amplifier circuitry 33. This data signal is processed in amplifier circuitry 33, buffered in output buffers 128, 128A, and/or 128B, and finally asserted at pins DQ0–DQ15. During such read operation, input buffers 122, 122A, and 122B are disabled.

Chip 103 also includes a pad which receives a high voltage $V_{pp}$ from an external device, and a switch 121 connected to this pad. During some steps of a typical erase or program sequence (in which the cells of array 16 are erased or programmed), control unit 29 sends a control signal to switch 121 to cause switch 121 to close and thereby assert the high voltage $V_{pp}$ to various components of the chip including X decoder 12. Voltage $V_{pp}$ is higher (typically $V_{pp}$=12 volts) than the normal operating mode supply voltage (typically $V_{cc}$=5 volts or $V_{cc}$=5.5 volts) for the MOS transistors of chip 103.

When reading a selected cell of array 16, if the cell is in an erased state, the cell will conduct a first current which is converted to a first voltage in sense amplifier circuitry 33. If the cell is in a programmed state, it will conduct a second current which is converted to a second voltage in sense amplifier circuitry 33. Sense amplifier circuitry 33 determines the state of the cell (i.e., whether it is programmed or erased corresponding to a binary value of 0 or 1, respectively) by comparing the voltage indicative of the cell state to a reference voltage. The outcome of this comparison is an output which is either high or low (corresponding to a digital value of one or zero) which sense amplifier circuitry 33 sends to output buffers 128 and 128B (and through multiplexer 124 to output buffer 128A). One or more of the output buffers in turn asserts a corresponding data signal to corresponding ones of pins DQ0–DQ15 (from which it can be accessed by an external device).

It is important during a write operation to provide the wordline of the selected cell with the proper voltage and the drain of the selected cell with the appropriate voltage level (the voltage determined by the output of each input buffer, asserted through latch/multiplexer 130 to circuit 14), in order to successfully write data to the cell without damaging the cell.

Internal state machine 120 of control unit 29 of chip 103 controls detailed operations of chip 103 such as the various individual steps necessary for carrying out programming, reading and erasing operations. State machine 120 thus functions to reduce the overhead required of a processor (not depicted) typically used in association with chip 103.

Memory operations, including programming, reading, and erasing can be initiated in various ways. For all operations, the chip enable signal $\overline{CE}$ must be made active (low). To perform a read operation, write enable signal $\overline{WE}$ must be made inactive (high). For a write operation, signal $\overline{WE}$ must be made active (low). In order to reduce the likelihood of accidental modification of data, erase and program operations require receipt of two consecutive commands that are processed by command execution logic unit 124. The program and erase commands are provided by the associated processor to data I/O pins DQ0–DQ7, forwarded to input buffer 122, and then forwarded to the command execution logic unit 124 for processing.

If memory array 16 is to be erased (typically, all or large blocks of cells are erased at the same time), the processor causes the Output Enable $\overline{OE}$ pin to be inactive (high), and the Chip Enable $\overline{CE}$ and Write Enable $\overline{WE}$ pins to be active (low). The processor then issues an 8 bit command 20H (0010 0000) on data I/O pins DQ0–DQ7, typically called an Erase Setup command (each of I/O pins DQ0–DQ7 corresponds to an I/O pad). This is followed by issuance of a second eight bit command D0H (1101 0000), typically called an Erase Confirm command. Two separate commands are used to reduce the possibility of an inadvertent erase operation.

The commands are transferred to data input buffer 122, and the commands are then transferred to command execution logic unit 124 of control unit 29. Logic unit 124 then instructs state machine 120 to perform all the numerous and well known steps for erasing array 16.

Once an erase sequence is completed, state machine 120 updates an 8 bit status register 126, the contents of which are transferred to data output buffer 128A which is connected to data I/O pins DQ0–DQ7 of the memory system. The processor periodically polls the data I/O pins to read the contents of status register 126 in order to determine whether an erase sequence has been completed and whether it has been completed successfully.

During a typical erase operation, it is desired to erase all the cells of array 16 (or an erase block of the cells) so that the threshold voltages are all within a specified voltage range. That range is typically a small positive voltage range such as from +1.5 to +3.0 volts. If the erased cells fall within this range, the cell to be read (the "selected" or "target") cell will produce a cell current in a read operation. The presence of cell current flow indicates that the cell is in an erased state (logic "1") rather than a programmed state (logic "0"). Cell current is produced in a selected erased cell if the voltage applied to the control gate of the cell, by way of the wordline connected to X decoder 12, exceeds the threshold voltage of the erased cell. In addition, cells which are not being read ("deselected" cells) are prevented from producing a cell current even if such cells have been erased to a low threshold voltage state By way of example, for cells located in the same row as the selected cell, by definition, share the same wordline as the selected cell. However, the drains of the deselected cells will be floating thereby preventing a cell current from being generated. Deselected cells in the same column will not conduct cell current because the wordlines of such deselected cells are typically grounded. Thus, the gate-source voltage of these cells will be insufficient to turn on these deselected cells even if they are in an erased state.

An example of a flash memory array which can be employed as memory array 16 of chip 103 is described in U.S. patent application Ser. No. 08/606,246, entitled "Segmented Non-Volatile Memory Array with Multiple Sources with Improved Word Line Control Circuitry," filed on Feb. 23, 1996 and assigned to the assignee of the present application.

The present invention is useful as an improvement to flash memory systems of the type designed to emulate magnetic disk drive systems. This type of flash memory system is typically implemented as a card (for insertion into a computer system) with a chip set mounted thereon, where the chip set includes an onboard controller and several memory chips controlled by the controller. Each memory chip implements an array of flash memory cells organized into independently erasable blocks. A conventional flash memory system of this type can be modified in accordance with the invention to avoid unnecessary writes of data to sectors of the flash memory array.

In the past, magnetic hard disk systems have been the dominant storage media for computers and related systems. The low cost and high capacity offered by this technology has made magnetic hard disk systems the mainstay in the computer industry. Because of the dominance of this technology, virtually all computer systems use and support this technology. The support of magnetic disk systems is evident by the software associated with the disk drives. The dominant computer operating system known as "DOS" (Disk Operating System) is essentially a software package used to manage a disk system. The DOS software has been developed by IBM Corporation, Microsoft Corporation, and Novell as the heart of widely used computer software. The first generation of Microsoft Corporation's "Windows" operating system software was essentially a continuation of the original DOS software with a user friendly shell added for ease of use.

The DOS software was developed to support the physical characteristics of hard drive structures, supporting file structures based on heads, cylinders and sectors. The DOS software stores and retrieves data based on these physical attributes. Magnetic hard disk drives operate by storing polarities on magnetic material. This material is able to be rewritten quickly and as often as desired. These characteristics has allowed DOS to develop a file structure that stores files at a given location which is updated by a rewrite of that location as information is changed. Essentially all locations in DOS are viewed as fixed and do not change over the life of the disk drive being used therewith, and are easily updated by rewrites of the smallest supported block of this structure. A sector (of a magnetic disk drive) is the smallest unit of storage that the DOS operating system will support. In particular, a sector has come to mean 512 bytes (each byte consisting of eight bits) of information for DOS and most other operating systems in existence. DOS also uses clusters as a storage unit. Clusters, however, are nothing more than the logical grouping of sectors to form a more efficient way of storing files and tracking them with less overhead.

The development of flash memory integrated circuits has enabled a new technology to offer competition to magnetic hard drives and offer advantages and capabilities that are hard to support by disk drive characteristics and features. The low power, high ruggedness, and small sizes offered by a solid state flash memory system make such a flash memory system attractive and able to compete with a magnetic hard disk drive system. Although a memory implemented with flash memory technology may be more costly than a hard disk drive system, computers and other processing systems are being developed that require (or benefit greatly from) use of flash memory features.

Thus, flash memory systems have been developed that emulate the storage characteristics of hard disk drives. Such a flash memory system is preferably structured to support storage in 512 byte blocks along with additional storage for overhead associated with mass storage, such as ECC (error correction code) bits and/or redundant bits. A key to this development is to make the flash memory array respond to a host processor in a manner that looks like a magnetic disk assembly so the operating system can store and retrieve data in a known manner and be easily integrated into a computer system including the host processor.

To make a flash memory easily integratable into a host computer, two basic approaches have been developed. One approach is to configure the flash memory as a storage array, and to load special software into the host to translate conventional operating system (e.g., DOS) commands into flash commands and procedures for assertion to the flash memory. This approach uses the host computing power to act as a controller for the utility that manages the flash memory (rather than including such a controller in the flash memory itself).

Another approach is to make the interface to the flash memory identical to a conventional interface to a conventional magnetic hard disk drive. This approach has been adopted by the PCMCIA standardization committee, which committee has promulgated a standard for supporting flash memory systems with a hard disk drive protocol. A flash memory card (including one or more flash memory array chips) whose interface meets this standard can be plugged into a host system having a standard DOS operating system with a PCMCIA-ATA (or standard ATA) interface. Such a flash memory card is designed to match the latter standard interfaces, but must include an onboard controller which manages each flash memory array independent of the host system. This approach has several advantages, including the following: there are no special system requirements for the host system (so ease of host system design is assured); no extra memory is required in the host, allowing for better use of the host memory; and the flash memory system runs independently of the host, freeing the host computer to do other tasks while the flash memory is storing or retrieving data from a flash memory array. However, the approach requires a controller onboard the flash memory to implement the equivalent of an operating system behind the PCMCIA interface.

An example of a flash memory array for use in a flash memory system that emulates a magnetic disk drive will be described with reference to FIG. 2. The flash memory array structure shown in FIG. 2 may be suitable for low cost applications of the type commonly implemented using low cost magnetic disk drives. Memory array 16 of FIG. 2 has 544 bytes per row of cells (each byte consisting of eight bits, where each memory cell is capable of storing one bit). Thus, each row of cells is equivalent to a magnetic disk sector (512 bytes of data plus 32 bytes of "overhead").

Memory array 16 of FIG. 2 is partitioned into large "decode" blocks of cells (e.g., eight large decode blocks as shown in FIG. 2) that are physically isolated from one another. This partitioning of blocks allows defects in one decode block (e.g., decode block 16A) to be isolated from the other decode blocks in the array, allows defective decode blocks to be bypassed by a controller, and allows for high usage of die and enhances overall yield of silicon produced (driving down the cost of flash mass storage systems).

The expression "decode block" is used to denote a block of cells of a memory array which are sufficiently physically isolated from the other cells of the array that the disturb effect on the cells in the decode block (due to high voltage application to the other cells of the array, e.g., during erasing or programming of the other cells) is negligible. In one case, an entire memory array is a single decode block. More typically, a memory array includes two or more decode blocks.

In the array of FIG. 2, each decode block is subdivided into eight independently erasable blocks, sometimes referred to herein as "erase blocks." In the FIG. 2 example, each erase block (e.g., erase block 16B) consists of rows of flash memory cells, with each row being capable of storing seventeen "packets" of bits, and each packet consisting of 32 bytes (each byte consisting of eight bits). Thus, each row (capable of storing 544 bytes) corresponds to one conventional disk sector (comprising 544 bytes), and each row can store 512 bytes of user data as well as a field of 32 ECC bytes for use in error detection and correction and other bits associated with sector management. In the FIG. 2 example, each erase block corresponds to two "cylinders" of data (in the sense that this expression is used in a conventional magnetic disk drive), with each cylinder consisting of 256K bits of data organized into 64 sectors. Thus, each erase block in the FIG. 2 example consists of 128 sectors of data.

Still with reference to FIG. 2, each erase block (e.g., erase block 16B) can be independently erased in response to signals from the controller. All flash memory cells in each erase block are erased at the same (or substantially the same) time, so that erasure of an erase block amounts to erasure of a large portion of array 16 at a single time.

In many normal usages of flash memory systems (other than disk emulation systems), an entire memory is written (or erased) or entire decode blocks are written (or erased) at one time. However, in a disk emulation system this is typically not done, as the data is typically very dynamic with small portions (e.g., individual rows of flash memory cells) being rewritten many times while other small portions remain unchanged. To accomplish the latter type of data updating, the controller will write data to free locations (e.g., rows) and when the memory is to be updated it will write the new (updated) data to other free rows (not previously written), marking the previously written rows as old (obsolete, and ready to be erased). The system will keep track of these obsolete rows and will erase an entire erase block when it becomes filled or almost filled with obsolete rows. Updated data (to replace data in one row of one erase block) may be placed in another erase block or even another decode block or possibly even a different flash memory chip. The constant rewriting and moving of files will result in erase blocks being constantly programmed and erased. In DOS it is typical for new files to be updated heavily and unused files to be not updated or never changed once generated. This typical use of files will result in portions of memory being updated frequently while other areas will remain stagnant and unchanged.

In flash memory systems, writes of data to flash memory cells are slow and they cause wear on the cells. This wear limits the useful life of conventional flash memory systems and reduces their overall reliability. The present invention overcomes these limitations (by applying data discrimination to avoid unnecessary writes to flash memory cells).

A file of data to be written to cells of a disk emulation system (a flash memory system which emulates a magnetic disk drive) typically consists of sectors of data. During writing of a file to cells of such a system, each of the sectors of data is typically written to a different row of cells (or to another distinct set of cells which has capacity to store a sector of data, and which is thus sometimes denoted herein as a "sector" of cells). The inventor has recognized that in many cases, a file of new data to be written to the cells corresponds to a previously written file of "old" data, with many sectors of the new data being identical to corresponding sectors of the old data.

It would be desirable to reduce the number of writes to an array (of flash memory cells) that must be performed in order to keep the array updated. Doing so would result in less stress on the cells, and would thus increase the operating life of the array and achieve better system reliability. In addition, system performance would be greatly improved, by reducing the time spent by system in writing data to cells and reducing overall command overhead. However, until the present invention, it had not been known how to achieve such write reduction in flash memory systems which emulate magnetic disk drives or in other types of flash memory systems.

SUMMARY OF THE INVENTION

In preferred embodiments, the invention is a memory system including one or more arrays of memory cells (e.g., flash memory cells or other nonvolatile memory cells), and each array is organized into sectors of cells, either physically (e.g., with each row of cells corresponding to a sector) or logically (with no specific correspondence between each sector and the physical position of the cells comprising the sector). Each cell is indicative of a stored data bit (whether the cell is in an erased or programmed state), and each sector of cells is indicative of a sector of stored data. The system includes circuitry which compares new data (to be written to the array) with stored data that has been "preread" from a selected sector (or other set) of the cells, where the selected sector (or other set) is to be updated with the new data. The system prevents a write of the new data to the array if the new data is identical to the stored data. If the new data is not identical to the stored data, the system writes the new data to a second one of the sectors (or other sets) of the cells, where the second one of the sectors (or sets) corresponds to the selected sector (or set) in the following sense: the system marks the selected sector (or set) as "old" (or "obsolete") and keeps track of the fact that the second one of the sectors (or sets) contains updated data which replaces data in the obsolete selected sector (or set).

In preferred embodiments, the memory system is designed to emulate a magnetic disk drive, the cells of the array are organized into sectors, and each of the sectors of cells can store the same amount of data as can a sector of a conventional magnetic disk drive supported by the DOS operating system (i.e., 512 bytes of data). In some of such preferred embodiments, each array of nonvolatile memory cells is organized into rows and columns of the cells, and each of the rows is a sector of cells capable of storing a sector of data.

Preferably, the system includes a controller which includes logic circuitry for performing the comparison. In response to the comparison determining that the new data is identical to the previously stored data, the controller preferably generates a confirmation signal indicating that the new data has been written to the array (rather than actually writing the new data to the array). Typically, the memory system communicates with a host processor (host) and the confirmation signal is sent to the host (in response to a command from the host that the new data be written to the array).

Other aspects of the invention are the method implemented by any of the described embodiments of the memory system of the invention.

DETAILED DESCRIPTION OF THE PREFERRED EMBODIMENTS

Preferred embodiments of the invention will be described with reference to FIGS. 3, 4, 5, and 6. One such embodiment is the computer system shown in FIG. 3. This computer system includes processor 2 (sometimes referred to herein as a host processor), input device 1 (which can be a keyboard) which can be manipulated by a human user to enter data and/or commands to processor 2, and flash memory chip 3. Flash memory chip 3, which is a memory subsystem of the computer system of FIG. 3, replaces a conventional magnetic disk drive system (or other, memory subsystem). Variations on the system of FIG. 3 include both a flash memory chip (such as chip 3 of FIG. 3) and at least one other memory subsystem (such as a conventional magnetic disk drive system). Of course, it is contemplated that the computer system of FIG. 3 can also include other peripheral devices, such as a display device.

Figure 3:
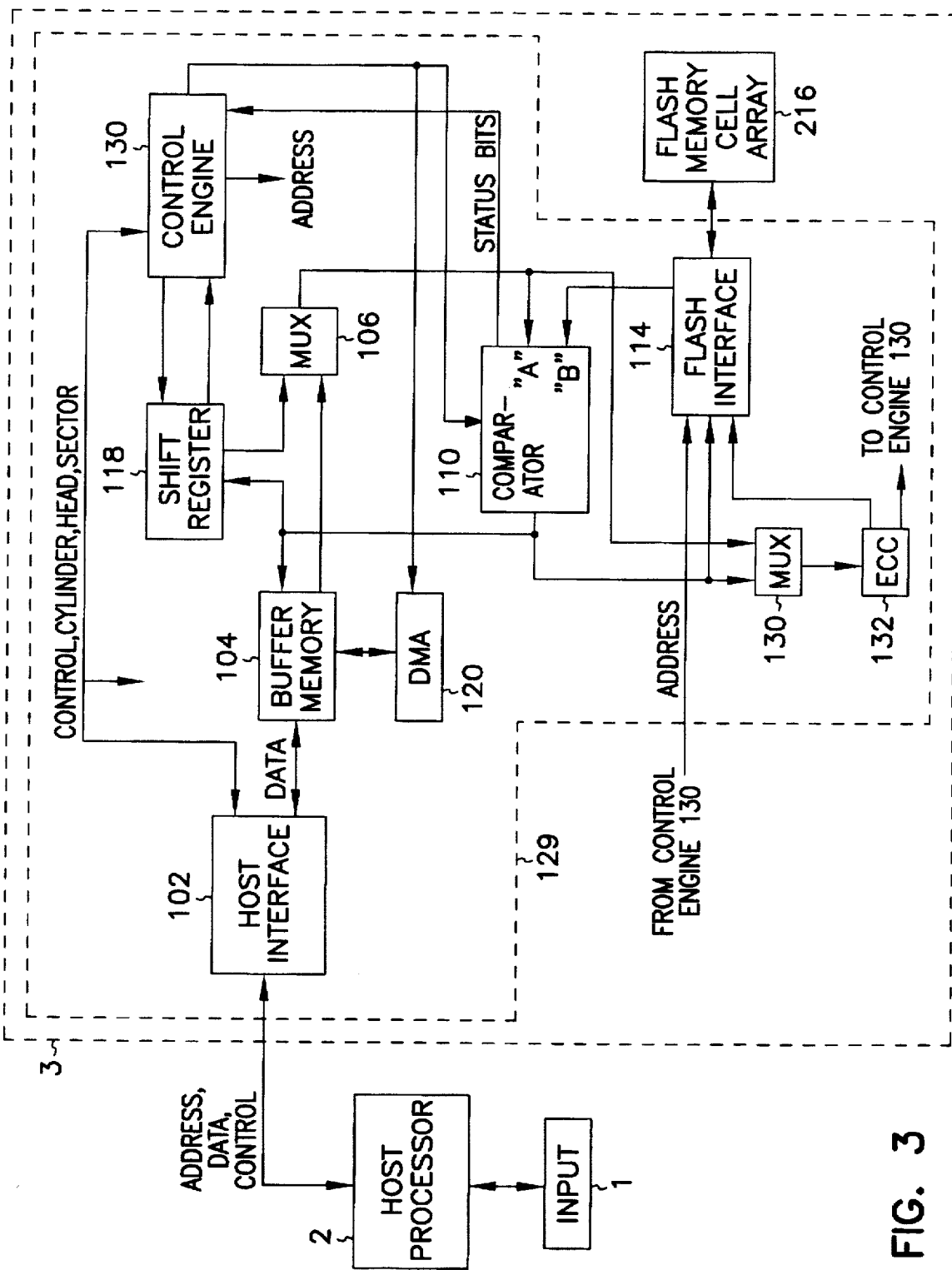
FIG. 3 is a block diagram of a computer system including a processor and an embodiment of the integrated flash memory system of the invention.

Flash memory chip 3 shown in FIG. 3 includes controller 129 and array 216 of nonvolatile memory cells (which are preferably nonvolatile flash memory cells). Memory chip 3 of FIG. 3 can be identical to chip 103 of FIG. 1, except in that chip 3 includes controller 129 which is designed and programmed in accordance with the invention (rather than controller 29 of FIG. 1), and in that controller 129 includes host interface 102, multiplexer 130, error detection and correction circuit 132, and flash interface 114. In preferred implementations, interface 102 receives binary data and address bits from host processor 2 (and sends binary data bits from memory array 216 to processor 2). Preferably, processor 2 is programmed with a standard DOS operating system and includes a PCMCIA-ATA interface (of the type discussed above), and interface 102 complies with the PCMCIA-ATA standard and thus can communicate with the standard PCMCIA-ATA interface of processor 2.

Figure 1:
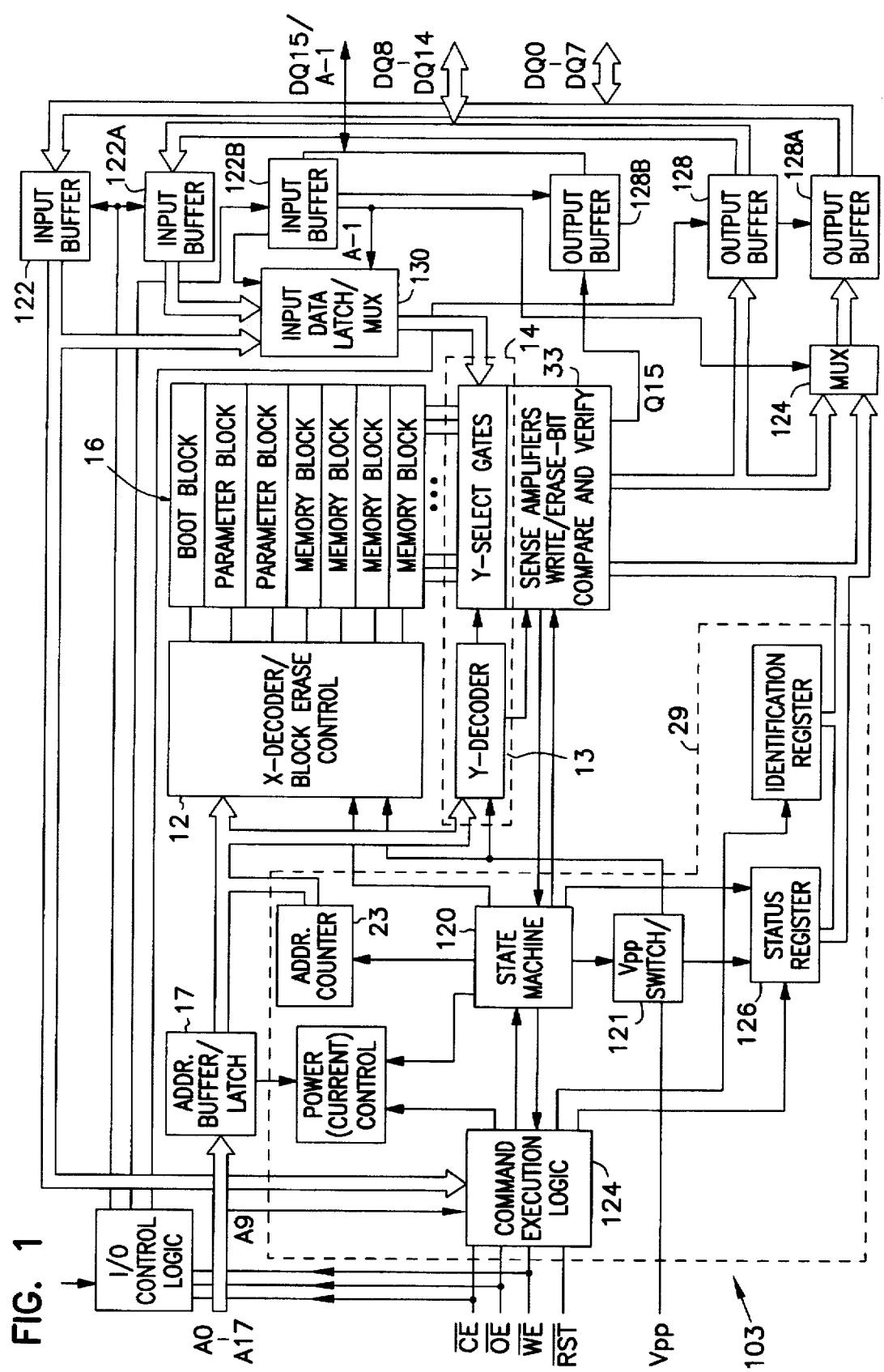
FIG. 1 is block diagram of a conventional nonvolatile (flash) memory circuit (implemented as an integrated circuit), including a conventional controller for controlling memory operations of the circuit.
Figure 2:
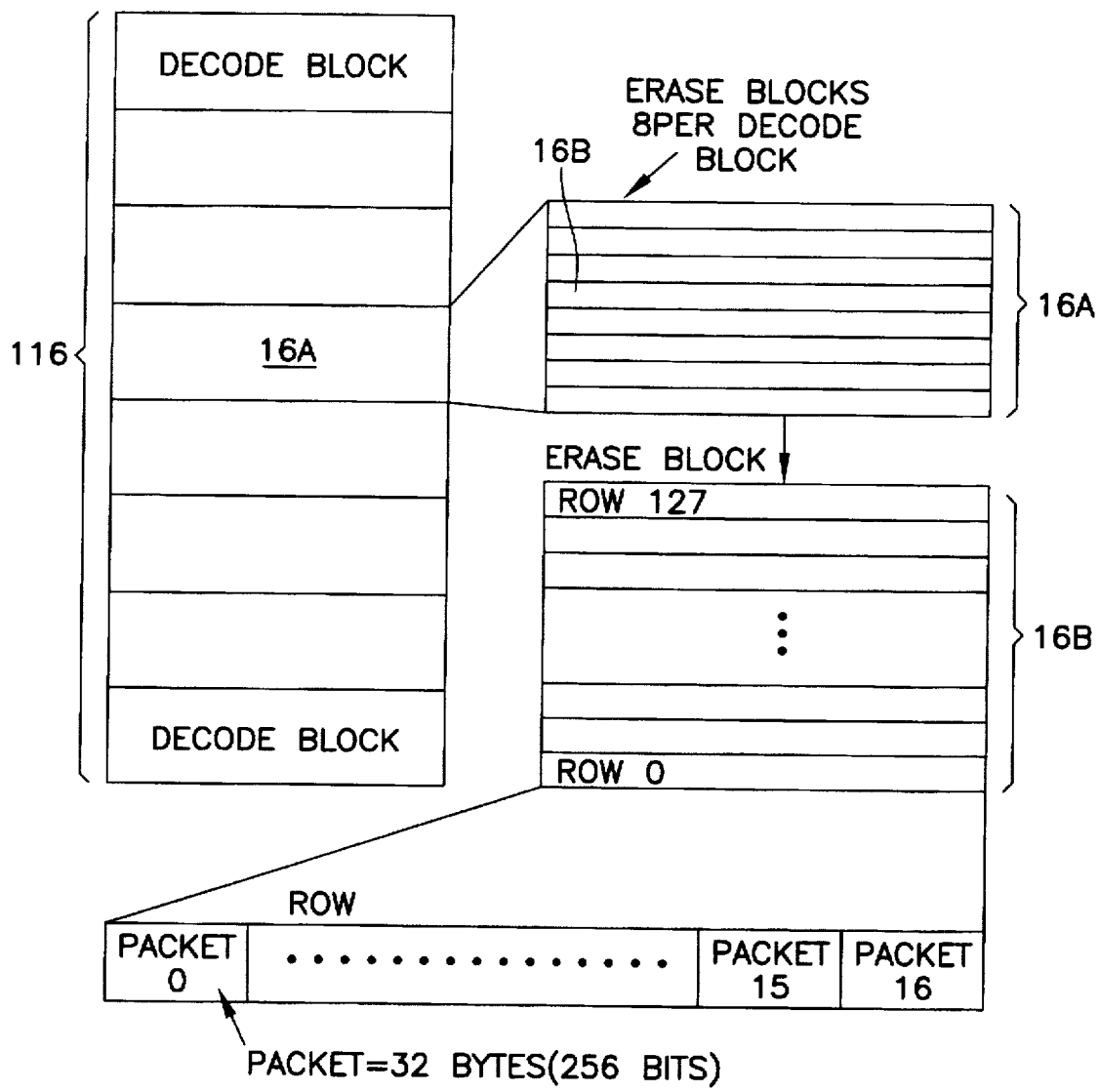
FIG. 2 is a diagram of the manner in which cells of a flash memory array are organized in one flash memory system which emulates a magnetic disk drive.

Flash memory array 216 of FIG. 3 preferably includes a cell array identical to array 116 of FIG. 2 (which can be identical to array 16 of FIG. 1) and circuitry which performs the functions of elements 12, 14, and 33 of FIG. 1. Flash interface 114 receives data (to be written to array 114) and address bits from other elements of chip 3 and asserts corresponding data and address bits with appropriate timing and format to array 216. Flash interface 114 also reads data bits from cells of array 216 (e.g., from any selected sector of cells of array 216) and asserts the data bits which it reads with appropriate timing and format to other elements of chip 3 (including to comparator circuit 110). The description of those components of FIG. 3 which correspond to components of FIG. 1 has been provided above with reference to FIG. 1, and will not be repeated below.

The cells of flash memory array 216 of FIG. 3 (and the cells of array 16 of FIG. 1) are organized into decode blocks. Each decode block is organized into independently erasable erase blocks (as is each decode block of array 116 shown in FIG. 2). In some implementations of the FIG. 3 embodiment, memory array 216 is an array of nonvolatile memory cells other than flash memory cells. Preferably however, each cell of array 216 is implemented as a flash memory cell.

Figure 6:
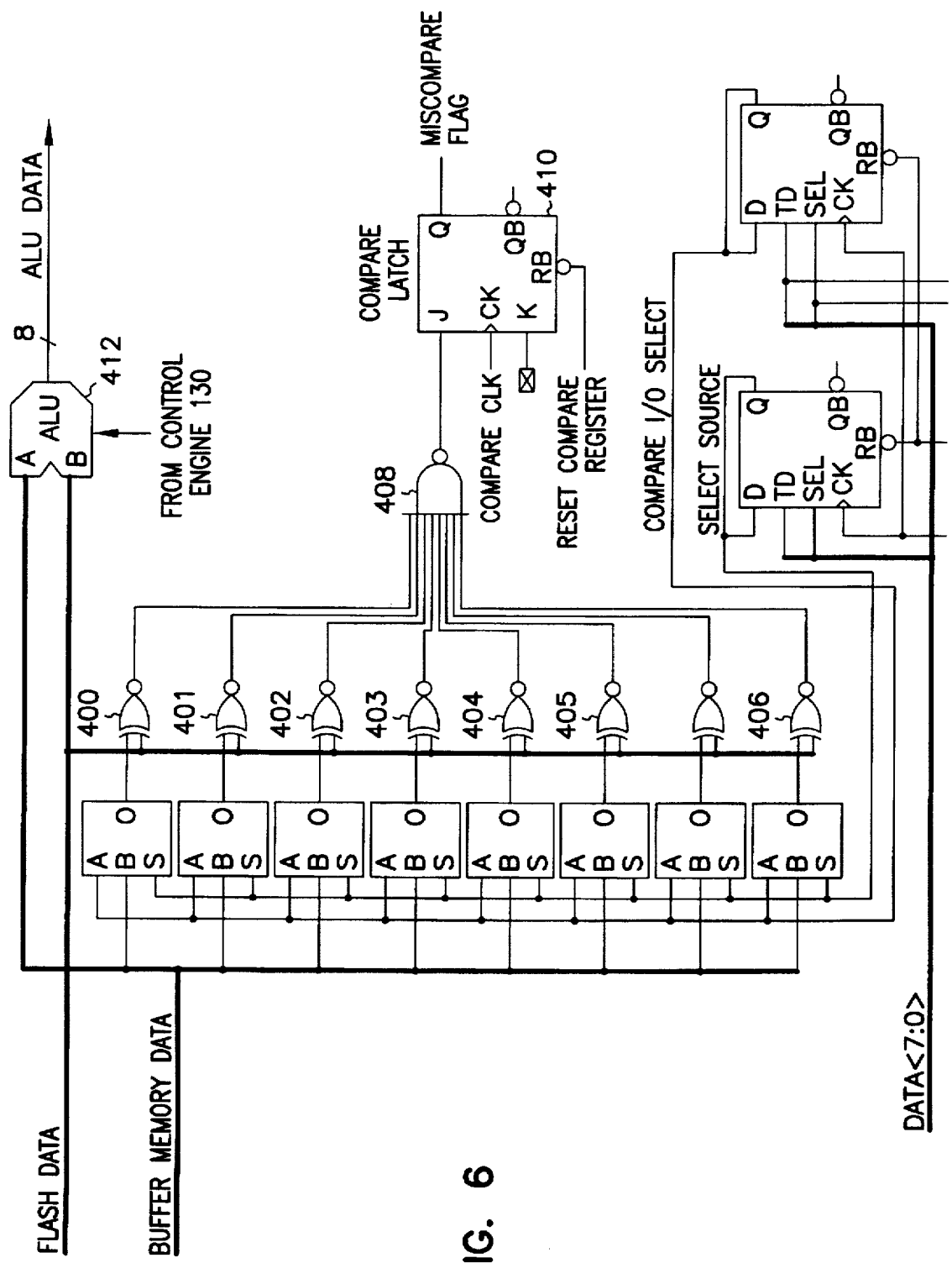
FIG. 6 is a schematic diagram of a preferred embodiment of comparator circuit 110 of FIG. 3.

With reference to FIG. 3, in response to control signals and address bits from processor 2 (or another external host), interface 102 sends the address bits (including bits identifying cylinder, head, and sector addresses) to control engine 130 of controller 129, and asserts internal control signals to appropriate components of controller 129 (including control engine 130) as required to implement each memory operation specified by each control signal from host processor 2 (e.g., a read of some or all cells of array 216, an erase of one or more erase blocks of array 216, or a write of data to some or all cells of array 216). In response to the address bits, control engine 130 generates translated address bits and sends the translated address bits to flash interface 114. Among the internal control signals asserted by interface 102 are enable/disable signals (as well as presets) which are asserted (from control engine 130) to comparator circuit 110 at appropriate times. FIG. 6 is a preferred embodiment of circuit 110.

In the FIG. 6 embodiment, comparator circuit 110 includes an array of XNOR (exclusive NOR) gates 400–406 whose outputs are all connected to NAND gate 408. The output of NAND gate 408 is presented to the input of JK register 410 at the J input, with the K input connected to ground (logic low). During preread checks (i.e., during the inventive preread and compare operations), the controller (controller 129 of FIG. 3) will first issue a control signal (Reset Compare Register) that will force register 410 to the clear (reset) state. The controller will then fetch a byte of data from flash memory array 216 and a corresponding byte of data from buffer memory 104. The corresponding bits of each byte will be input to the XNOR gates 400–406 resulting in a positive output from each of the XNOR gates if the inputs thereto are the same (1,1 or 0,0) or a negative output from each XNOR gate whose inputs are different (0,1 or 1,0). if all bits of each byte match each other (i.e., the byte read from flash array 216 is identical to that read from buffer memory 104), the eight XNOR outputs will be all logic high and will drive the output of NAND 408 low. The low output of NAND 408 is presented to the J input of JK register 410. The controller will then generate a clock sampling the compare condition, as determined by the logic level of the J input. If the J is low (the two bytes match each other), the JK register will remain clear indicating that the data has compared. The controller will then fetch the next sequential byte of data from flash memory array 216 and the next byte of data from buffer memory 104, again repeating the compare and sample operation. If any of the bytes of data read from flash memory 216 miscompares with a corresponding one of the bytes of write data in buffer 104, the J input of circuit 410 will be driven to a logic high and the JK register will toggle to the set state when sampled by the compare clock. Once the JK register becomes set, it will remain set indicating a miscompare has occurred, regardless of any further clocking. The controller will monitor this JK register output and will abort the compare operation as soon as the miscompare status is detected. Aborting the operation when a miscompare is detected will result in saved overhead time (avoiding wasted time in clocking to the end of the sector). This translates to performance savings to the system. If a miscompare is detected, the controller will then generate the necessary control signals to write the new set of data in buffer memory 104 to a new (erased) sector of flash memory array 216. It will also mark the sector just read from flash memory array 216, which has been found to miscompare, to an "obsolete" state.

If the compare operation has compared all bytes of the sector and found no miscompare (between any byte read from array 216 and a corresponding byte read from memory 104), the two sectors (stored in array 216 and memory 104) are of identical value, resulting in no need to write the new sector to array 216. In this case, the sector residing in array 216 is left untouched and the host is notified that the sector write is complete. This bypass of a write operation results in a big time savings, since flash writes are slow compared to reads. A flash write of a sector can take 1 to 5 milliseconds while a read compare will take approximately 50 microseconds. Thus, a large savings is gained when a sector is not required to be written to array 216. If all the data in a file is changing (i.e., each compare operation performed on a sector in array 216 and a new sector of the file in memory 104 determines that the two sectors are not identical), the compare operation will result in unnecessary overhead that degrades system performance. To avoid this problem, the controller preferably has two ways of preventing this overhead from occurring (or reducing its magnitude).

The simplest feature to prevent the preread comparisons from adding to the overall overhead is to design the controller to be operable in a mode in which it does not perform the compare operation (i.e., in response to a command from the host). This capability is preferably supported by a vendor unique command from the host that tells the controller not to perform the read compares when issued a write command.

With reference again to FIG. 6, circuit 110 preferably also includes an arithmetic logic unit (ALU) 412 which performs desired arithmetic operations on either or both of the bit streams received at the "A" and "B" inputs of circuit 110. In response to control signals from control engine 130, ALU 412 can pass through unaltered either the data received at its "A" input (from buffer memory 104 via the "A" input of circuit 110) or the data received at its "B" input (from array 216, via interface 114 and the "B" input of circuit 110), at appropriate times during system operation.

When the controller is operating in a mode in which read compares are allowed (and performed), some typical considerations of file usage are preferably taken into account to allow the controller not to do a read compare of all write files. In a computer that is storing a file in a group of sectors, the file tends to change toward the end of the file, as the end of the file is typically the most recently worked on portion. In a file with a change (relative to a previously stored version of the file), many times a small change will result in data being shifted, resulting in everything after the change looking like a change since it will be bit/byte shifted. Noting this characteristic, the controller is preferably programmed to start a write operation by doing a preread and compare on each successive sector. As soon as a miscompare is detected, the controller preferably aborts the process of performing preread and compares, and instead enters a mode in which it automatically writes each succeeding new sector to memory cells of the array and obsoletes each older sector corresponding to (and replaced by) each succeeding new sector, without any further comparisons.

Typically, the control signals and address bits received at interface 102 from the external host (processor 2) indicate one or more sectors of array 216 which are to be updated with new data (also received from the host or from a memory controlled by the host). In response to the internal control signals and address bits asserted by interface 102 (in response to the control signals and address bits received from host processor 2), controller 129 writes each sector of the data to a "free" sector (e.g., row) of array 216 which corresponds to the sector (and cylinder and head) specified by the host (or controller 129 determines that there is no need to perform such write, in accordance with the invention). When controller 129 determines that a previously written sector of array 216 needs to be updated with new data received from host processor 2, controller 129 causes chip 3 to execute the following operations: controller 129 causes flash interface to write the new data to a "free" sector of array 216, which is an erased sector other than the previously written sector (i.e., an erased sector of array 216 to which data has not been written since the last erase of the entire erase block containing the erased sector); controller 129 marks the previously written sector as old (obsolete, and ready to be erased); and typically also controller 129 asserts a confirmation signal to interface 102 (to be relayed to the host to confirm that the requested write operation has been performed). As will be explained below, control engine 130 of controller 129 is preferably programmed in accordance with the invention to assert such a confirmation signal even when it has prevented a write of the updating data to array 216 (after controller 129 has determined that there is no need for such a write, because the updating data is identical to previously written data which the updating data is intended to replace). Controller 129 is programmed to keep track of the obsolete sectors of array 216 (typically, each sector is a row of cells of array 216) and to cause the erasing of an entire erase block when it becomes filled or almost filled with obsolete sectors. Controller 129 can cause the new data (updating data) from the host to be written to another erase block (an erase block other than the erase block containing the previously written sector to be updated) or even another decode block or possibly even a different flash memory chip.

With reference again to FIG. 3, control engine 130 asserts control signals to the other elements of controller 129 (including elements 106 and 110) and to flash interface 114 in response to the internal control signals it receives from interface 102, to cause controller 129 and interface 114 to execute operations in accordance with the present invention. Control engine 130 determines which set of sub-operations or functions need to be performed to implement the memory operation specified by processor 2 (e.g., a write of data in buffer memory 104 to array 216, or a read of data from array 216 to buffer memory 104). In a typical implementation of control engine 130, control engine 130 includes a microcontroller which performs the high level operations, such as command and status handshaking with the host via interface 102. This microcontroller is responsible for locating the proper memory location (within array 216) from a given cylinder, head and sector address from the host. This microcontroller will handle error correction (ECC) calculations and will also correct errant data bits found by the ECC calculations. While such a microcontroller can be programmed to efficiently handle these activities, it will typically be too slow to control the real time operations of managing the data flow and flash interface gating. Because of the performance limitations, a specially designed sequencer will often be included in control engine 130 to control the real time functions of the flash data gating and flash interface control. In an implementation using a microcontroller and a specially designed sequencer, the microcontroller will typically act as the master to the slave sequencer. This is done by having the microcontroller activate the sequencer to do specific functions in response to the microcontroller's commands. In this environment, the sequencer will be given commands such as "read sector," "write enable," or "erase a block." The locations of the cells of array on which to do these operations are given to the sequencer from the microcontroller.

Typically, the sequencer would perform the specified operation by managing the DMA circuit 120 and the bad location hardware (error detection circuitry), as well as handling the address and command handshaking with the flash port logic (flash interface 114).

Various structures of microcontroller and sequencer logic are possible, but the overall methodology will preferably resemble the structures used by conventional magnetic hard disk drives.

An alternate design approach that may be used to implement control engine 130 is to replace the microcontroller and sequencer by a single RISC processor or DSP (digital signal processor). Use of such processor cores provides the speed required (which otherwise would be provided by a sequencer) as well as the high level intelligence required. This approach would simplify the design and would shift the development burden more to firmware design. This approach would also give better flexibility for design changes, through firmware, and would possibly reduce cost where a small core would replace large blocks of logic.

Data to be written to array 216 are received at interface 102, and written from interface 102 to buffer memory 104. Buffer memory 104 is preferably an SRAM circuit, but it can alternatively be an array of nonvolatile memory cells or some other memory circuit. Memory 104 has capacity to store a set of data. This set can be a "sector" of the data, and such a sector of data can consist of a number (e.g., sixteen) of "packets" of the data (where "sector" and "packet" have been explained above). In accordance with the invention, comparator circuit 110 operates in a mode in which it compares a set (e.g., a sector) of new data temporarily stored in buffer 104 to be later written to flash memory array 216 (e.g., to a sector of array 216), with a previously stored set (e.g., sector) of data. The previously stored set of data is data, stored in cells of flash memory array 216 (e.g., in a sector of array 216 to which a sector of data in buffer 104 is to be written), which is to be replaced by the new data in buffer memory 104. The previously stored set of data is preread from array 216 and asserted to comparator 110 in accordance with the invention.

For specificity, the rest of the detailed description will describe embodiments in which a "sector" of new data in a buffer memory is to be written to a "sector" of cells of a flash memory array. However, it is contemplated that in other embodiments, a set of new data (not necessarily a "sector" of new data) in a buffer memory is to be written to memory cells of a flash memory array (not necessarily to a "sector" of such cells).

With reference again to FIG. 3, in accordance with another aspect of the invention, control engine 130 is programmed to prevent a write of the new data from memory 104 to array 216 when comparator 110 has determined that the new data in buffer 104 is identical to the previously stored data (in array 216) which the new data is intended to replace.

In preferred implementations of the FIG. 3 system, array 216 is organized into erase blocks of cells, and each row of each erase block stores a quantity of bits which corresponds to a sector of a magnetic disk drive (and thus each row is denoted as a sector of cells). In one such implementation, memory 104 receives from interface 102 (and stores) a burst of 512 eight-bit bytes of new data (4096 bits) and each row of array 216 consists of 4352 cells (and thus each row can store the 4096 bits of new data plus an additional 256-bit packet of "overhead" bits). In variations on the single chip embodiment of FIG. 3, array 216 and controller 129 are implemented in two or more separate chips. Array 216 can itself be replaced by an array implemented in two or more chips.

With reference to FIG. 3, memory system 3 operates as follows when a sector of new data to be written to a sector of array 216 has been stored in buffer memory 104. Control engine 130 (e.g., a sequencer within control engine 130) sends a control signal to direct memory access circuit 120 ("DMA unit" 120) to set the DMA pointer to the start of a sector, sets comparator logic circuit 110 to a mode of operation in which it compares the data value asserted to its "A" input to the data value asserted to its "B" input and asserts to control engine 130 a status bit indicative of whether each pair of a sequence of pairs of data values simultaneously asserted to circuit 110 match (or alternatively, a sequence of status bits, each indicative of whether each pair of data values simultaneously asserted to circuit 110 match), sets DMA 120 to a mode of operation in which it sequentially asserts the 8-bit bytes of one sector of data from memory 104 to multiplexer 106, causes multiplexer 106 to enter a mode of operation in which multiplexer 106 passes the data it receives from memory 104 to the "A" input of circuit 110, and causes a sequence of eight-bit bytes of a corresponding sector of stored data to be read from array 216 and passed through interface 114 to the "B" input of circuit 110. Multiplexer 106 can be controlled to select either eight bits of data received in parallel from shift register 118, or eight bits of data received in parallel from buffer memory 4, and asserting each set of selected bits to circuit 110.

Preferably, circuit 110 includes a register for an interim status bit indicative of whether all pairs of data values already asserted to circuit 110 (in parallel to the "A" and "B" inputs of circuit 110) are matching pairs. E.g., circuit 110 can add a "zero" bit to the contents of the register each time a matching pair of data values is received at the "A" and "B" inputs of circuit 110, and circuit 110 can add a "one" bit to the contents of the register each time a non-matching pair of data values is received at the "A" and "B" inputs of circuit 110. The "one" bit will be held and will not be reset to zero. Preferably, circuit 110 includes logic circuitry for asserting a first status signal (e.g., a single "one" bit) to control engine 130 when the contents of the status register within circuit 110 changes from a "zero" bit to a "one" bit, and for asserting a second status signal (e.g., a single "zero" bit) to control engine 130 if the status register (within circuit 110) still contains a "zero" bit after an entire sector of data has been received at each of the "A" and "B" inputs of circuit 110 and been processed by comparator 110.

In response to such a "first" status signal from comparator circuit 110 (indicating that the new sector of data in buffer 104 does not match the previously stored sector of data read from array 216), the comparison operation (which had been performed by circuit 110) is aborted, and control engine 130 sets circuit 110 to operate in a mode in which it does not alter data received at its "A" input (and instead passes the data through to its output terminal), and control engine 130 puts flash interface 114 into a mode in which it receives the output of circuit 110. Control engine 130 also causes DMA unit 120 to set the DMA address back by one sector, and DMA unit 120 causes the same sector of data bits to be reread from memory 104 to multiplexer 106 (as a sequence of eight-bit bytes). Multiplexer 106 then asserts the sector of data from buffer memory 104 to circuit 110, circuit 110 passes the data through (unaltered) to its output terminal, and the data asserted at circuit 110's output terminal is received by flash interface 114 and written by flash interface 114 to a sector of cells (a "free" sector of erased cells) of flash memory array 216 in a well known manner. In preferred implementations, multiple streams of the bits from buffer memory 104 are written to array 216 in parallel, so that at any one time, bits are being written to two or more cells of array 216. In one preferred implementation, two hundred fifty six (256) streams of bits are written to array 216 in parallel (so that a packet of 32 eight-bit bytes of the data is written to array 216 during a single write operation). Control engine 130 keeps track of the sector of array 216 to which the new data has been written, generates a confirmation signal indicating that the new sector of data has been written to the sector of cells specified by the host (processor 2), and asserts the confirmation signal to host interface 102. In response, interface 102 relays the confirmation signal (or asserts a corresponding confirmation signal) to the host. Typically, control engine 130 does not keep track of the status of each packet of a sector, and it confirms the writing of a sector of data but not a subset (e.g., a packet) of a sector of data.

In response to the described "second" status signal from comparator circuit 110 (indicating that the new sector of data in buffer 104 matches the previously stored sector of data read from array 216), control engine 130 prevents a write of the new sector of data to array 216. In the preferred embodiments, control engine 130 instead generates a confirmation signal indicating that the new sector of data has been written to the sector of cells of array 216 in which the matching sector of data has previously been stored (rather than actually writing the new data to array 216), and asserts the confirmation signal to host interface 102. In response, interface 102 relays the confirmation signal (or asserts a corresponding confirmation signal) to the host (processor 2).

Shift register 118 is optionally employed to store temporarily one or more overhead bits, to be written to array 216 for use in subsequent processing of data bits to be written from buffer memory 104 to array 216. Also, overhead bits read from array 216 can be stored in register 118 for use at appropriate times during processing of corresponding data read from array 216. Preferably, control engine 130 is capable of monitoring the contents of shift register 118 and shifting the contents of register 118 by sequencer control to assert from register 118 selected overhead bits corresponding to any selected packet of a sector of data (read from array 216 or to be written to array 216).

Also preferably, control engine 130 can alter the length of each DMA transfer to fit the desired volume of data to be written to array 216 (i.e., the size of each sector, packet, or other quantity of data asserted from buffer memory 104 is preferably controllable). Preferably, control engine 130 can alter the DMA address to allow multiple reads (rereads) of the same quantity of data from buffer 104 during a DMA transfer operation.

After an entire sector of data in buffer memory 104 has been processed in accordance with the invention (by performing a comparison in circuit 110 and writing the sector of data to array 216), the sequencer within control engine 130 selects shift register 118 as a data source. At this point, shift register 118 contains overhead bits corresponding to the sector of data written to array 216, typically because controller 129 has caused ECC check bits (e.g., from circuit 132 discussed below), defect bits, and system flags for the sector of data to be written to register 118 as a set of overhead bits for the sector. The overhead bits are sequentially asserted (as a sequence of eight-bit words) from shift register 118 through multiplexer 106 and circuit 110 to flash interface 114, and are then written to cells of array 216. In the above-mentioned implementation of array 216 in which each row of array 216 consists of 4352 cells (and can store sixteen 256-bit packets of data plus an additional 256-bit packet of overhead bits), a sector of data (4096 bits of data stored in buffer 104) is written to a single row of array 216, and a packet of 256 overhead bits from register 118 are also written to the same row of array 216.

To read a sector of data from array 216, the FIG. 3 system operates as follows. The sequencer within control engine 130 causes flash interface 114 to read the overhead bits for the sector from array 216. The overhead bits that are read from array 216 are asserted through circuit 110 to shift register 118 (and/or to circuit 132 discussed below). Control engine 130 (e.g., the sequencer within control engine 130) then sets the DMA address to the start of the sector, and causes DMA unit 120 and flash interface 114 to execute a DMA operation in which the first packet of bits (e.g., the first 32 eight-bit bytes of bits) is read from array 216, asserted from interface 114 to circuit 110, and written from the output of circuit 110 to buffer memory 104 (and optionally through multiplexer 130 to circuit 132). Control engine 130 (e.g., the sequencer within control engine 130) monitors the DMA operation for completion of the packet transfer to memory 104.

Upon completion of the packet transfer, control engine 130 causes another DMA operation to be performed to read the next packet from array 216 and write the packet to buffer memory 104. This sequence of steps is repeated for each packet of the sector to be read from array 216, until all packets of the sector have been read from array 216 and written to buffer memory 104.

The error correction code for the sector (error correction code bits which are a subset of the overhead bits previously read from array 216 and stored in register 118) is preferably also checked, under control of control engine 130, to determine if there is any detectible error in the data in buffer memory 104. If no error is detected, the data are transferred from buffer memory 104 through host interface 102 to host processor 2.

More specifically, circuit 3 preferably includes multiplexer circuit 130 and error detection and correction circuit 132 (ECC 132) connected as shown in FIG. 3 (with the input of ECC 132 connected to the output of multiplexer 130). When circuit 3 operates in a write mode in which it writes data from buffer memory 104 to array 216, the data being written (or to be written) to array 216 is asserted from buffer memory 104 through multiplexer 106, circuit 110, and multiplexer 130 to ECC 132. In this mode, ECC 132 processes the data to calculate check bits. ECC 132 asserts the check bits to flash interface 114, and flash interface 114 causes the check bits to be written to array 216.

When circuit 3 operates in a read mode in which it reads data from array 216, flash interface 114 asserts the data (and corresponding check bits) which it reads from array 216 through circuit 110 and multiplexer 130 to ECC 132. In this mode, ECC 132 processes the check bits and data to identify errors in the data, and ECC 132 asserts appropriate signals to control engine 130 (e.g., signals indicative of syndrome bits) as a result of this operation. ECC 132 thus performs error detection on the data read from array 216. Control engine 130 reads the syndrome bits from ECC 132 and calculates a correction vector based thereon (e.g., in a well known manner). Once the correction vector and displacement are known, control engine 130 alters the data in buffer memory 104 to correct at least one detected error therein. The corrected data will then be sent to the host (via host interface 102).

In some embodiments, to read a set of data bits (and any corresponding overhead bits for the set) from a location (e.g., a sector) of a flash memory array, the controller of the inventive flash memory system identifies the location where the set of data is stored and reads any corresponding overhead bits (typically stored in a sublocation distinct from that where the data of interest is stored). The controller stores and/or processes the overhead bits. Then, the first subset of the set of data is then DMA gated from the flash memory array and written into an internal data buffer. The next subset of the set of data is then DMA gated from the flash memory array and written into the internal data buffer, and this process repeats until all subsets of the set of data have been read from the array and written to the internal data buffer. After the entire set of data has been stored in the internal data buffer, the controller preferably performs error detection (using ECC check bits read from the flash memory array), and if the data is found correct the controller causes the data to be sent from the internal data buffer to a host over a controller interface. Reads of different locations (e.g., sectors) of the flash memory proceed with this same procedure until data from all desired locations has been sent to the host. When all the data has been sent to the host, the read operation is complete.

Control engine 130 is preferably programmed with software for implementing the invention as described with reference to FIG. 3. Throughout the specification, including in the claims, the expression that a device is "programmed with software" for performing an operation in accordance with the invention is used in a broad sense to denote that the device includes software, firmware, or dedicated hardware which gives the device the capability of performing the operation. Also throughout the specification, including in the claims, the term "circuitry" is used to denote any hardware comprising active and/or passive electrical components (e.g., semiconductor devices, tubes, resistors, etc.) whether or not such hardware is programmed with software (unless the term "circuitry" is qualified to refer to a narrower class of such hardware). A general purpose processor which includes transistors or other electrical components and which is programmed with software causing the processor to process electrical signals (indicative of binary data) that it receives in accordance with an algorithm is an example of "circuitry" within the scope of this definition.

In the FIG. 3 circuit, controller 129 includes hardware as specified (including comparator 110 which is implemented by hardwired logic circuitry). It is contemplated that in alternative embodiments, controller 129 can be a general purpose processor (including a memory) which is programmed with software enabling the processor to perform an operation in accordance with the invention (e.g., in response to external signals from host processor 2 specifying operations on memory array 216).

It should be understood that although controller 129 is a component of the same integrated circuit (chip 3) as is flash memory array 216 in the FIG. 3 embodiment of the invention, in other embodiments of the invention the controller and flash memory array will be implemented in distinct chips. For example, it is contemplated that the invention can be embodied in a chip set (such as that shown in FIG. 4) which includes a controller chip and two or more memory array chips, each of which operates under control of the controller chip. Such a chip set can be implemented to emulate a magnetic disk drive (with the controller chip operating in response to commands received from a remote host). It is contemplated that the controller would be capable of performing a memory operation on any selected one of the memory array chips. For example, when instructed to write a sector of data to non-volatile memory cells of a selected one of the memory array chips, it would compare the sector to a previously stored sector of data read from the selected memory array chip in accordance with the invention, and either write the sector of data to the selected memory array chip or generate a confirmation signal indicating that the sector has been written to selected memory array chip without actually writing the sector to the chip (depending on the outcome of the comparison).

Figure 4:
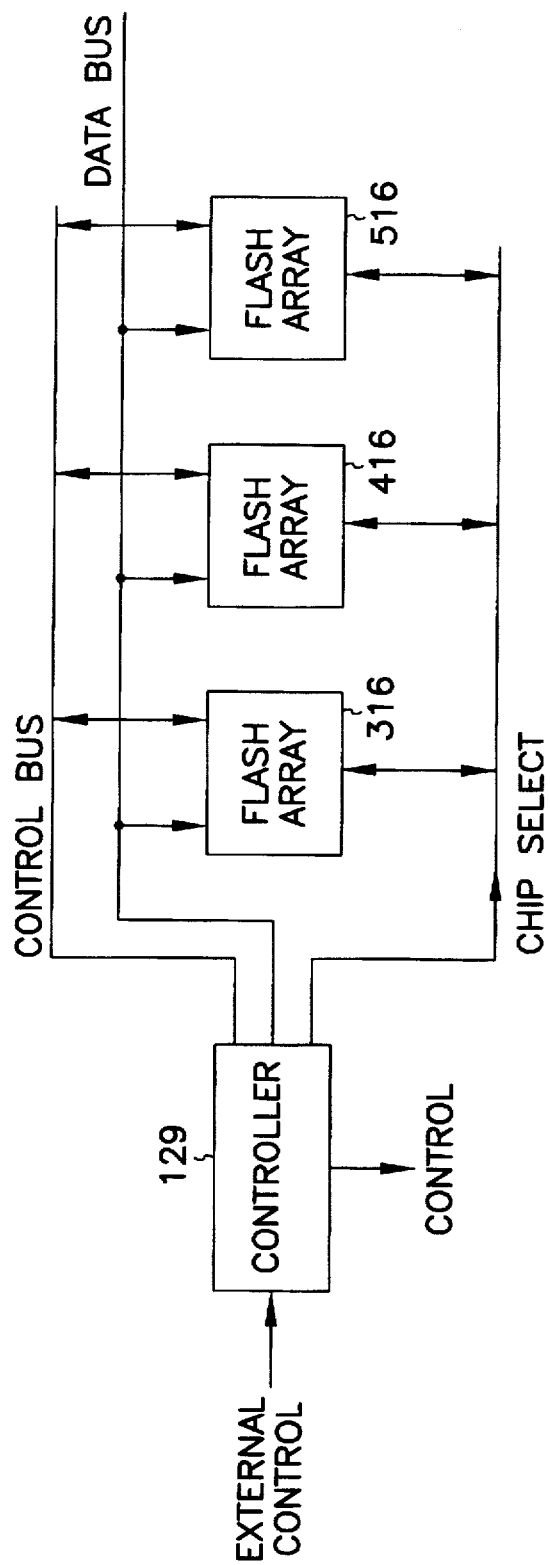
FIG. 4 is a block diagram of another embodiment of the flash memory system of the invention, including several flash memory arrays (each implemented as a separate integrated circuit) and a controller for controlling memory operations of any selected one of the arrays and for implementing the invention.

FIG. 4 is a block diagram of a multi-chip embodiment of the inventive flash memory system, including identical nonvolatile memory arrays 316, 416, and 516 (each implemented as a separate integrated circuit) and controller 129'. Each cell of each of arrays 316, 416, and 516 is preferably a flash memory cell. Also preferably, each of arrays 316, 416, and 516 comprises at least one decode block of flash memory cells (and preferably several such decode blocks), each decode block includes at least one erase block of cells, and each of the erase blocks includes at least one row of cells. Controller 129' is programmed to control memory operations of any selected one of arrays 316, 416, and 516, and to process a sector of data to be written to any selected one of arrays 316, 416, and 516 in accordance with the invention. Controller 129' can differ from controller 129 of FIG. 3 only in that controller 129' includes hardware and/or software for selecting one of the flash memory arrays (whereas controller 129 need not have such a capability).

Figure 5:
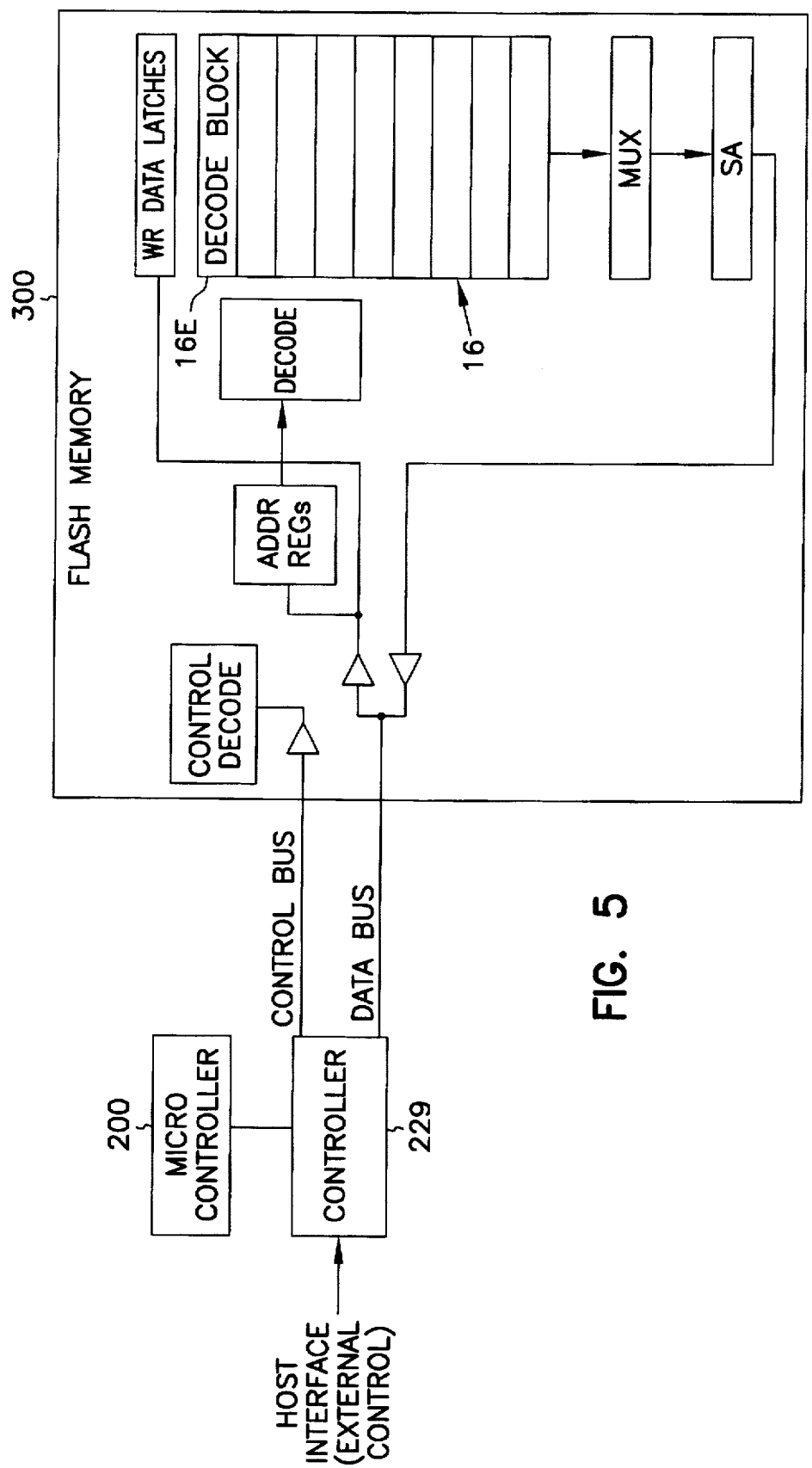
FIG. 5 is a block diagram of another embodiment of the flash memory system of the invention.

Another embodiment of the flash memory system of the invention is shown in FIG. 5. In the FIG. 5 embodiment, flash memory chip 300 is controlled by an external controller chip 229. Flash memory chip 300 includes an array 16 of flash memory cells, and array 16 consists of decode blocks of cells (such as decode block 16E). Controller 229 operates with microcontroller chip 200. In FIG. 5, chips 200 and 229 together perform the functions of controller 129 of the FIG. 3 embodiment. Flash memory chip 300 of FIG. 5 need not include control logic circuitry (of the type included in control unit 29 of memory chip 103 of FIG. 1), and instead controller 229 of FIG. 5 includes hardware and software for controlling memory operations of chip 300 (and for implementing the present invention).

Several embodiments of the method and apparatus of the invention have been described with reference to FIGS. 3, 4, 5, and 6. Although these embodiments have been described in some detail, it is contemplated that changes from these embodiments can be made without departing from the spirit and scope of the invention as defined by the appended claims.

What is claimed is:

1. A memory circuit, including:
   an array of memory cells organized into sets, each of said sets having capacity to store a set of data;
   a buffer memory which stores a first set of data to be written to the array to replace a second set of data stored in a first one of the sets of the cells;
   interface circuitry coupled to the array and operable to read the second set of data from said first one of the sets of the cells;
   a comparator coupled to the buffer memory to receive the first set of data and coupled to the interface circuitry to receive the second set of data which has been read from the first one of the sets of the cells, the comparator being operable to compare at least a portion of the first set of data with at least a portion of the second set of data and to generate a control signal having a first state if the first set of data matches the second set of data; and
   a control engine coupled to the comparator to receive the control signal, and operable to prevent a write of the first set of data to the array in response to the control signal having the first state.

2. The memory circuit of claim 1, wherein each of the sets of the cells is a sector of the cells, each said sector of the cells has capacity to store a sector of data, the first set of data is a first sector of data, and the second set of data is a second sector of data.

3. The memory circuit of claim 1, wherein the comparator asserts the control signal with a second state to the control engine in response to determining that the first set of data does not match the second set of data, and wherein the control engine causes the memory circuit to write the first set of data from the buffer memory to a second one of the sets of the cells in response to the control signal having the second state.

4. The memory circuit of claim 1, also including:
   a direct memory access circuit coupled to the buffer memory and to the control engine, and operable to cause sequential assertion to the comparator of subsets of the first set of data under control of the control engine.

5. The memory circuit of claim 4, wherein the direct memory access circuit is also operable to cause repeated assertion to the comparator of a single subset of the first set of data under control of the control engine.

6. The memory circuit of claim 1, wherein each of the cells of the array is a nonvolatile memory cell.

7. The memory circuit of claim 6, wherein each said nonvolatile memory cell is a flash memory cell.

8. The memory circuit of claim 1, wherein the array is organized into rows of the cells, and each of the sets of the cells is one of said rows.

9. The memory circuit of claim 1, wherein the set of data is a quantity of data which matches the capacity of a sector of a magnetic disk drive.

10. A memory system for use with a host device, said memory system including:
an array of memory cells organized into sets of said cells;
a host interface coupled to receive memory commands and data from the host device, and operable to generate control signals in response to the memory commands;
a buffer memory coupled to the host interface and configured to receive and store a first set of the data from the host interface, said first set of data to be written to the array to replace a second set of data stored in a first one of the sets of the cells;
array interface circuitry coupled to the array and operable to read the second set of data from said first one of the sets;
a comparator coupled to the buffer memory to receive the first set of data and coupled to the array interface circuitry to receive the second set of data which has been read from the first one of the sets, the comparator being operable to compare at least a portion of the first set of data with at least a portion of the second set of data and to assert a first signal with a first state in response to determining that the first set of data matches the second set of data; and
a control engine coupled to the comparator to receive the first signal, coupled to the host interface to receive the control signals, and coupled to the array interface circuit, the control engine being operable to prevent a write of the first set of data to the array in response to reception of both the first signal having the first state and a first one of the control signals, wherein the first one of the control signals is indicative of a memory command from the host device which would otherwise cause the memory circuit to write said first set of data to the array.

11. The memory circuit of claim 10, wherein the comparator asserts the first signal with a second state to the control engine in response to determining that the first set of data does not match the second set of data, and wherein the control engine causes the memory circuit to write the first set of data from the buffer memory to a second one of the sets of the cells in response to reception of both the first signal having the second state and said first one of the control signals.

12. The memory circuit of claim 10, wherein the control engine asserts a confirmation signal to the host interface in response to reception of both the first signal having the first state and said first one of the control signals, wherein the confirmation signal indicates that the first set of data has been written to the array.

13. The memory circuit of claim 10, wherein each of the cells of the array is a flash memory cell.

14. The memory circuit of claim 10, wherein the array is organized into rows of the cells, and each of the sets of the cells is one of said rows.

15. A method for operating a memory circuit in response to a command to write a first set of data to an array of memory cells of said memory circuit to replace a second set of data stored in the array, wherein the array is organized into sets of the cells and the second set of data is stored in a first one of the sets of the cells, said method including the steps of:
(a) reading at least a portion of the second set of data from said first one of the sets of the cells;

(b) comparing each portion of the second set of data which has been read from the array with a corresponding portion of the first set of data, and generating a control signal having a first state upon determining that the first set of data matches the second set of data; and
(c) in response to said control signal having the first state, generating a confirmation signal which indicates that the first set of data has been written to the array rather than writing said first set of data to the array.

16. The method of claim 15, also including the step of:
writing the first set of data to a buffer memory, and
wherein step (b) includes the step of reading said corresponding portion of the first set of data from the buffer memory to a first input of a comparator, while asserting said each portion of the second set of data to a second input of the comparator.

17. The method of claim 15, wherein step (a) includes the operation of sequentially reading portions of the second set of data from said first one of the sets while performing the operation of comparing in step (b), and wherein step (b) includes the step of:
asserting the control signal with a second state, and aborting step (a) and said operation of comparing in step (b), upon determining that the first set of data does not match the second set of data.

18. The method of claim 15, wherein step (b) includes the step of asserting the control signal with a second state in response to determining that the first set of data does not match the second set of data, and wherein step (c) includes the step of:
in response to the control signal having the second state, writing the first set of data to a second one of the sets of the cells and generating said confirmation signal which indicates that the first set of data has been written to the array.

19. The method of claim 15, wherein each of the memory cells is a flash memory cell, wherein the command is received from a host device, and wherein the method also includes the step of:
asserting the confirmation signal to the host device.

20. A method for operating a memory circuit including an array of memory cells organized into sets of the cells, said method including the steps of:
(a) receiving a command from a host device, said command indicating that a first set of data is to be written to the array to replace a second set of data previously stored in a first one of the sets of the cells,
(b) reading the second set of data from said first one of the sets of the cells;
(b) comparing at least a portion of the second set of data which has been read from the array with at least a portion of the first set of data;
(c) in response to a determination in step (b) that the first set of data matches the second set of data, asserting to the host device a confirmation signal indicating that the first set of data has been written to the array rather than writing said first set of data to the array, and in response to a determination in step (b) that the first set of data does not match the second set of data, writing the first set of data to a second one of the sets of the cells.

21. The method of claim 20, also including the step of:
receiving the first set of data and writing said first set of data to a buffer memory, and
wherein step (b) includes the step of reading at least said portion of the first set of data from the buffer memory to a first input of a comparator, while asserting at least said portion of the second set of data to a second input of the comparator.

22. The method of claim 20, wherein step (c) also includes the step of:

in response to said determination in step (b) that the first set of data matches the second set of data, asserting said confirmation signal to the host device as well as writing the first set of data to said second one of the sets of the cells.

23. The method of claim 20, wherein each of the memory cells is a flash memory cell, and wherein the method also includes the step of:

receiving the first set of data and writing said first set of data to a buffer memory, and wherein step (b) includes the step of reading at least said portion of the first set of data from the buffer memory to a first input of a comparator, while asserting at least said portion of the second set of data to a second input of the comparator.

24. A method for writing data to an array of memory cells, said method including the steps of:

writing a first set of data into a first set of the cells;

comparing at least a portion of a second set of data with a corresponding portion of the first set of data; and writing the second set of data to the array only upon determining as a result of the step of comparing that the second set of data differs from the first set of data.

25. The method of claim 24, wherein the step of comparing is performed in response to a command to write the second set of data to the array to replace the first set of data.

26. The method of claim 25, also including the step of:

upon determining as a result of the step of comparing that the second set of data is identical to the first set of data, generating a confirmation signal indicating that the second set of data has been written to the array rather than writing said second set of data to the array.

27. The method of claim 24, also including the step of:

sequentially reading subsets of the first set of data from the array in response to said command, wherein the step of comparing includes the step of:

comparing each of said subsets of the first set of data with a corresponding subset of the second set of data, until one of said subsets of the first set of data is determined to differ from the corresponding subset of the second set of data.

28. The method of claim 24 wherein each of the cells is a nonvolatile memory cell, and the step of writing includes the step of:

writing the second set of data into a second set of the cells upon determining as a result of the step of comparing that the second set of data differs from the first set of data.

29. The method of claim 24 wherein each of the cells is a flash memory cell.

30. The method of claim 24, wherein the array of memory cells is organized into sectors of the cells, the first set of the cells is a first one of the sectors of the cells, and each of the first set of data and the second set of data is a quantity of data which matches the capacity of a sector of a magnetic disk drive.

31. A memory system, including:

an array of memory cells organized into sets of the cells, each of said sets having capacity to store a set of data;

a buffer memory which stores a first set of data, wherein the first set of data is to be written to the array to replace a second set of data stored in a first one of the sets of the cells;

interface circuitry coupled to the array and operable to read the second set of data from said first one of the sets of the cells;

a comparator coupled to the buffer memory to receive the first set of data and coupled to the interface circuitry to receive the second set of data which has been read from the first one of the sets of the cells, wherein the comparator is operable to perform a comparison of at least a portion of the first set of data with at least a portion of the second set of data, in which it generates a control signal having a first state if the first set of data matches the second set of data, and in which it generates the control signal with a second state and aborts the comparison upon determining that the first set of data does not match the second set of data; and a control engine coupled to the comparator to receive the control signal, wherein the control engine is operable to prevent a write of the first set of data to the array in response to the control signal having the first state.

32. A nonvolatile memory circuit, comprising:

a group of nonvolatile memory cells;

a buffer sized to retain data to be written to said group of nonvolatile memory cells;

comparison circuitry coupled to the buffer and to the group of nonvolatile memory cells, and configured to compare a first set of data in the buffer with a second set of data in the group of nonvolatile memory cells and to generate a signal functionally indicative of a match between the first set of data and the second set of data, wherein the comparison circuitry is configured to generate a second signal which functionally indicates that the first set of data does not match the second set of data; and write circuitry coupled to the buffer and to the group of nonvolatile memory cells, and configured to prevent a write of the second set of data to the group of nonvolatile memory cells in response to the signal, and to write said second set of data to the group of nonvolatile memory cells in response to the second signal.

33. The nonvolatile memory circuit of claim 32, wherein each of the nonvolatile memory cells is a flash memory cell.

34. The nonvolatile memory circuit of claim 32, wherein the group of nonvolatile memory cells is a sector of the nonvolatile memory cells, and each of the first set of data and the second set of data is a quantity of data which matches the capacity of a sector of a magnetic disk drive.

35. A nonvolatile memory circuit, comprising:

a first group of nonvolatile memory cells;

a second group of memory cells sized to retain data to be written to said first group of nonvolatile memory cells;

comparison circuitry coupled to the second group of memory cells and to the first group of nonvolatile memory cells, and configured to compare a first set of data stored in the second group of memory cells with a second set of data stored in the first group of nonvolatile memory cells and to generate a signal functionally indicative of a match between the first set of data and the second set of data, wherein the comparison circuitry is configured to generate a second signal which functionally indicates that the first set of data does not match the second set of data; and write circuitry coupled to the second group of memory cells and to the first group of nonvolatile memory cells, and configured to prevent a write of the second set of data to the first group of nonvolatile memory cells in response to the signal, and to write said second set of data to the first group of nonvolatile memory cells in response to the second signal.

36. The nonvolatile memory circuit of claim 35, wherein each of the memory cells in the second group of memory cells is a nonvolatile memory cell.

37. The nonvolatile memory circuit of claim 35, wherein each of the nonvolatile memory cells is a flash memory cell.

38. The nonvolatile memory circuit of claim 35, wherein the first group of nonvolatile memory cells is a sector of the nonvolatile memory cells, and each of the first set of data and the second set of data is a quantity of data which matches the capacity of a sector of a magnetic disk drive.

39. A computer system, including:
a processor; and
a memory subsystem,
wherein said memory subsystem includes:
an array of memory cells organized into sets of said cells;
a processor interface coupled to receive memory commands and data from the processor, and operable to generate control signals in response to the memory commands;
a buffer memory coupled to the processor interface and configured to receive and store a first set of the data from the processor interface, said first set of data to be written to the array to replace a second set of data stored in a first one of the sets of the cells;
array interface circuitry coupled to the array and operable to read the second set of data from said first one of the sets;
a comparator coupled to the buffer memory to receive the first set of data and coupled to the array interface circuitry to receive the second set of data which has been read from the first one of the sets, the comparator being operable to compare at least a portion of the first set of data with at least a portion of the second set of data and to assert a first signal with a first state in response to determining that the first set of data matches the second set of data; and
a control engine coupled to the comparator to receive the first signal, coupled to the processor interface to receive the control signals, and coupled to the array interface circuit, the control engine being operable to prevent a write of the first set of data to the array in response to reception of both the first signal having the first state and a first one of the control signals, wherein the first one of the control signals is indicative of a memory command from the processor which would otherwise cause the memory circuit to write said first set of data to the array.

40. The system of claim 39, wherein the comparator asserts the first signal with a second state to the control engine in response to determining that the first set of data does not match the second set of data, and wherein the control engine causes the memory circuit to write the first set of data from the buffer memory to a second one of the sets of the cells in response to reception of both the first signal having the second state and said first one of the control signals.

41. The system of claim 39, wherein the control engine asserts a confirmation signal to the processor interface in response to reception of both the first signal having the first state and said first one of the control signals, wherein the confirmation signal indicates that the first set of data has been written to the array.

42. The system of claim 39, wherein each of the cells of the array is a nonvolatile memory cell.

43. The system of claim 42, wherein each said nonvolatile memory cell is a flash memory cell.

44. The system of claim 42, wherein the array is organized into rows of the cells, and each of the sets of the cells is one of said rows.

45. The system of claim 39, wherein the set of data is a quantity of data which matches the capacity of a sector of a magnetic disk drive.

46. A computer system, including:
a processor; and
a memory subsystem,
wherein said memory subsystem includes:
a group of nonvolatile memory cells;
a processor interface coupled to receive memory commands and data from the processor, and operable to generate control signals in response to the memory commands;
a buffer coupled to the processor interface and sized to retain data to be written to said group of nonvolatile memory cells; and
comparison circuitry coupled to the buffer and to the group of nonvolatile memory cells, and configured to compare a first set of data in the buffer with a second set of data in the group of nonvolatile memory cells in response to a first one of the control signals, and to generate a signal functionally indicative of a match between the first set of data and the second set of data as a result of said; and
write circuitry coupled to the buffer and to the group of nonvolatile memory cells, and configured to prevent a write of the first set of data to the group of nonvolatile memory cells in response to the signal, wherein the first one of the control signals is indicative of a memory command from the processor which would otherwise cause the memory circuit to write said first set of data to the group of nonvolatile memory cells.

47. The system of claim 46, wherein the comparison circuitry is configured to generate a second signal which functionally indicates that the first set of data does not match the second set of data, and wherein the write circuitry is configured to write said first set of data to the group of nonvolatile memory cells in response to the second signal.

48. The system of claim 46, wherein each of the nonvolatile memory cells is a flash memory cell.

49. The system of claim 46, also including:
an array of nonvolatile memory cells, wherein the group of nonvolatile memory cells is a sector of said array, and each of the first set of data and the second set of data is a quantity of data which matches the capacity of a sector of a magnetic disk drive.

50. A computer system, including:
a processor; and
a memory subsystem,
wherein said memory subsystem includes:
a first group of nonvolatile memory cells;
a processor interface coupled to receive memory commands and data from the processor, and operable to generate control signals in response to the memory commands;
a second group of memory cells coupled to the processor interface and sized to retain data to be written to said first group of nonvolatile memory cells; and
comparison circuitry coupled to the second group of memory cells and to the first group of nonvolatile memory cells, and configured to compare a first set of data in the second group of memory cells with a second set of data in the first group of nonvolatile memory cells in response to a first one of the control signals, and to generate a signal functionally indicative of a match between the first set of data and the second set of data as a result of said; and write circuitry coupled to the second group of memory cells and to the first group of nonvolatile memory cells, and configured to prevent a write of the first set of data to the first group of nonvolatile memory cells in response to the signal, wherein the first one of the control signals is indicative of a memory command from the processor which would otherwise cause the memory circuit to write said first set of data to the first group of nonvolatile memory cells.

51. The system of claim 50, wherein the comparison circuitry is configured to generate a second signal which functionally indicates that the first set of data does not match the second set of data, and wherein the write circuitry is configured to write said first set of data to the first group of nonvolatile memory cells in response to the second signal.

52. The system of claim 50, wherein each of the nonvolatile memory cells is a flash memory cell.

53. The system of claim 50, also including:

an array of nonvolatile memory cells, wherein the first group of nonvolatile memory cells is a sector of said array, and each of the first set of data and the second set of data is a quantity of data which matches the capacity of a sector of a magnetic disk drive.

* * * * *